United States Patent
Shaw et al.

(10) Patent No.: US 7,148,556 B2
(45) Date of Patent: Dec. 12, 2006

(54) HIGH PERFORMANCE DIODE-IMPLANTED VOLTAGE-CONTROLLED POLY RESISTORS FOR MIXED-SIGNAL AND RF APPLICATIONS

(75) Inventors: Jonathan A. Shaw, Fort Collins, CO (US); Sean Erickson, Fort Collins, CO (US); Kevin Nunn, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/984,286

(22) Filed: Nov. 9, 2004

(65) Prior Publication Data

US 2006/0097349 A1  May 11, 2006

(51) Int. Cl.
*H01L 23/62* (2006.01)
*H01L 29/00* (2006.01)

(52) U.S. Cl. ..................... 257/536; 257/359

(58) Field of Classification Search ........ 257/356–359, 257/528–543
See application file for complete search history.

(56) References Cited

U.S. PATENT DOCUMENTS

| 4,849,344 A * | 7/1989 | Desbiens et al. ........... 438/331 |
| 5,739,577 A * | 4/1998 | Tuttle ........................ 257/536 |
| 6,984,869 B1 * | 1/2006 | Erickson et al. ............ 257/536 |
| 2005/0116301 A1 * | 6/2005 | Shaw et al. ................. 257/380 |

* cited by examiner

*Primary Examiner*—Cuong Nguyen
(74) *Attorney, Agent, or Firm*—Yee & Associates, P.C.

(57) ABSTRACT

A p-type polysilicon resistor formed in the inter-level dielectric layer contains an implanted diode. A positive voltage applied to the diode modulates the depletion region of the diode and changes the absolute resistance of the p-type polysilicon resistor. This modulation occurs not only horizontally, but also vertically. The fact that the tunable resistor is a p-type polysilicon resistor means that this structure can easily be integrated into the process since polysilicon is used as a gate material for basic CMOS processing.

15 Claims, 6 Drawing Sheets

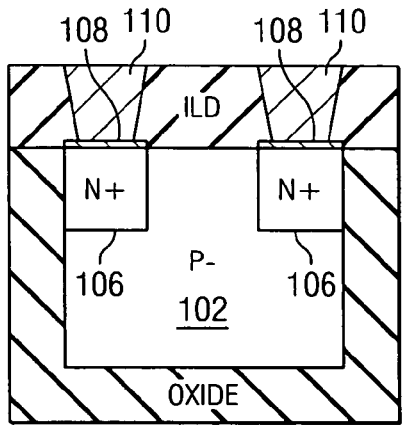
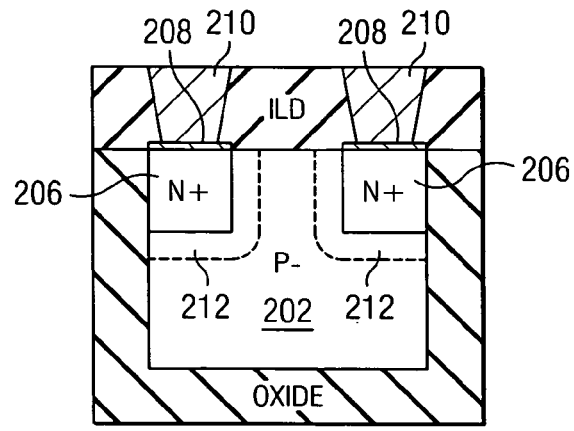
FIG. 1D    FIG. 2A
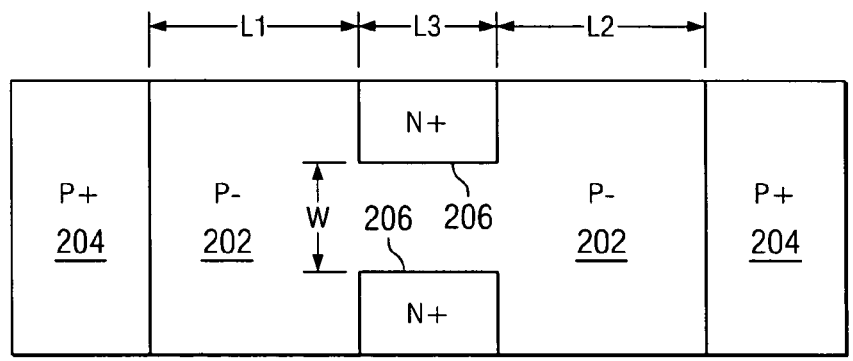
FIG. 2B
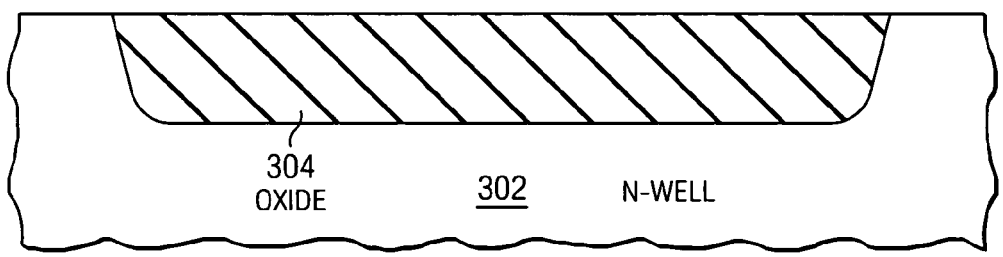
FIG. 3A

HIGH PERFORMANCE DIODE-IMPLANTED VOLTAGE-CONTROLLED POLY RESISTORS FOR MIXED-SIGNAL AND RF APPLICATIONS

BACKGROUND OF THE INVENTION

1. Technical Field

The present invention is directed generally toward a resistor and a method for making a resistor that is tunable to an absolute value.

2. Description of the Related Art

It is a well-known fact that in most processing technologies for manufacturing mixed-signal devices on silicon chips, resistors suffer from large process variation, with the actual resistance value varying from the predicted value by as much as 20%–30%. This is due in part to variations in the dopant profile and the resulting edge effects and to the fact that a fourth of a micron difference in the thickness of a salicide can alter the resistance by several orders of magnitude. There is currently no way to get around this problem; so analog designers make designs that do not rely on absolute values of resistance and rely more on matching of resistors. Even then, the resistor matching is best achieved with large area resistors, which wastes space on a die. This clearly limits the options for analog designs One existing solution is to use a precision external resistor off chip, although this adds significantly to the cost. Another is to use large resistors in parallel, which helps with matching internal to the die. However, these large area internal resistors are expensive in the area consumed and in the time spent laying out the structure. They also require additional simulation time to confirm that the design will work with the expected large variation of the resistors, which is expensive in terms of time, both manpower and machine time.

It would be highly desirable to utilize a process that can produce a resistor with less variability. This solution, however, would require that the steps necessary to make the resistor fit in with the processing steps already used, to avoid large costs associated with such a process change.

SUMMARY OF THE INVENTION

A p-type polysilicon resistor formed in the inter-level dielectric layer contains an implanted diode. A positive voltage applied to the diode modulates the depletion region of the diode and changes the absolute resistance of the p-type polysilicon resistor. This modulation occurs not only horizontally, but also vertically. The fact that the tunable resistor is a p-type polysilicon resistor means that this structure can easily be integrated into the process since polysilicon is used as a gate material for basic CMOS (complementary metal oxide semiconductor) processing.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1A–1D depict the structure of a polysilicon resistor from various views, according to an exemplary embodiment of the invention.

FIG. 2A depicts the structure of a polysilicon resistor in the same cross-section as FIG. 1D, showing the depletion area that forms around the diodes according to an exemplary embodiment of the invention.

FIG. 2B depicts a top-down view of a polysilicon resistor, showing several measurements of the resistor.

FIGS. 3A–3G depict the formation of the formation of a polysilicon resistor in the same cross-section as FIG. 1C, according to an exemplary embodiment of the invention.

DETAILED DESCRIPTION

An embodiment of the invention will now be explained with reference to the figures. The processes, steps, and structures described below do not form a complete process flow for manufacturing integrated circuits. The present invention can be practiced in conjunction with integrated circuit fabrication techniques currently used in the art, and only so much of the commonly practiced process steps are included as necessary for an understanding of the present invention. The figures represent cross sections of a portion of an integrated circuit during fabrication and are not drawn to scale, but instead are drawn so as to illustrate important features of the invention.

Structure of Resistor

Figure 1A:
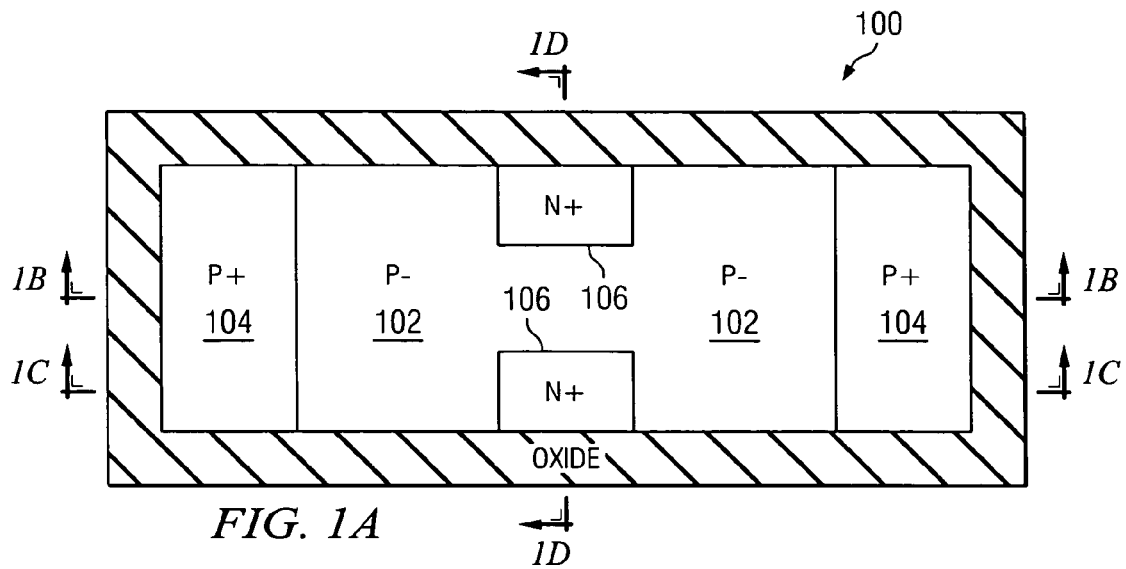

With reference to FIG. 1A, a top-down view of an embodiment of the invention is shown, after the implantation of the resistor, but prior to the formation of contacts. In this figure, the surface of resistor 100 forms a rectangle of polysilicon 102 that is surrounded by an oxide or other dielectric. Polysilicon 102 has been doped with a p-type dopant, with heavier areas of p-type doping 104 at each end of the rectangle where contacts will be formed. Near the midpoint of the rectangle are two areas 106 that have been doped with an n-type dopant. These two areas 106 will form diodes that can pinch off the current between the contact points 104.

Figure 1B:
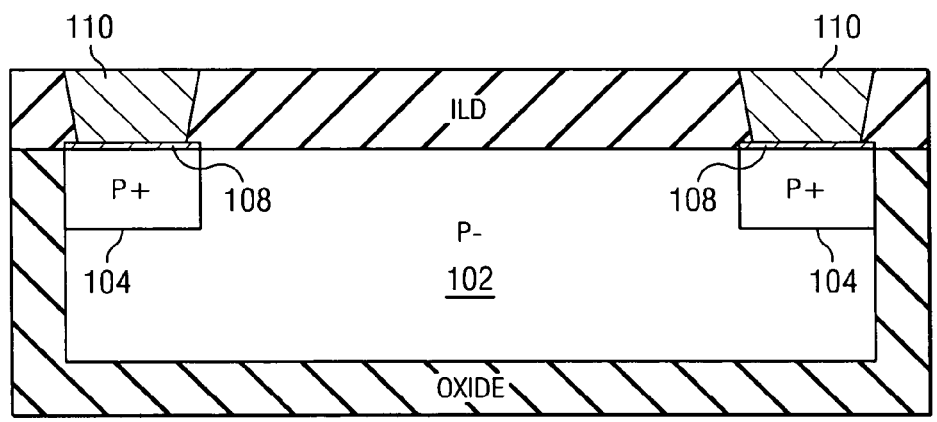
Figure 1C:
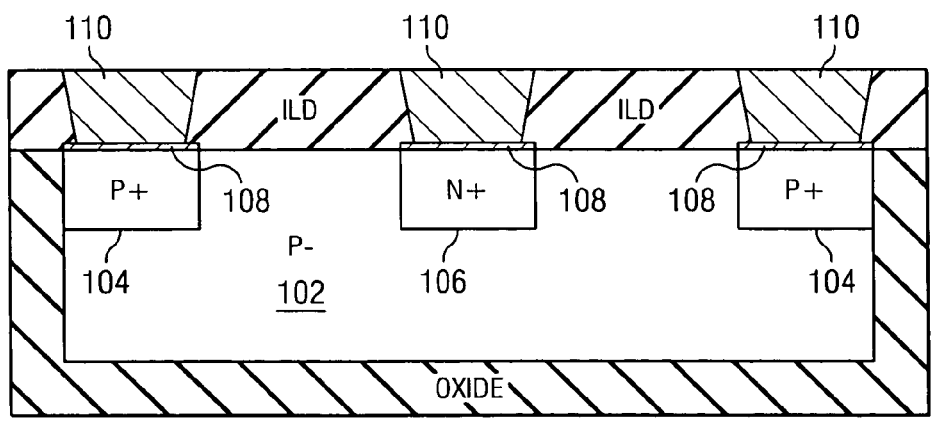

Turning now to FIG. 1B, a cross-section along the length of the resistor at its midpoint is shown. In this cross-section, only the regions doped with p-type doping are visible, although contacts have been added to the drawing. Body 102 of resistor 100 is seen, with contact regions 104 at either end. Each of contact regions 104 is shown with a layer of salicide 108, topped by a contact 110. A cross-section taken at an offset from the longitudinal midline of resistor 100 is similarly shown in FIG. 1C, except that this figure also shows n-type doped regions 106, with their own layer of salicide 108 and contact 110. Finally, FIG. 1D depicts an embodiment of the invention in a cross-section taken through the two n-doped regions 106.

Tuning the Resistor

Turning now to FIG. 2A, the action of the resistor will be discussed. In the completed circuit, contacts 210 are connected to form diodes. When a positive voltage is applied to contacts 210, a depletion region 212 forms around each of regions 206, with the size of depletion regions 212 growing as a greater voltage is applied. As the depletion regions grow larger, the resistance of the device increases and current through the device decreases. Thus the value of the resistor can be adjusted after manufacture. The ability to adjust a resistance in an analog circuit has many advantages, such as tunable voltage or current references, impedance matching, as well as reducing or shutting off current draw in a mixed signal block for a sleep mode. In an exemplary embodiment of the invention, a feedback circuit is utilized to maintain a stable, reliable value.

FIG. 2B depicts four important dimensions of the resistor: L1, L2, and L3, which define the length of the resistor, and together with its doping level determines the resistor's value, and W, the distance between the two diodes, which defines the effective width of the resistor. These dimensions can be optimized depending on specific design criteria.

Formation of Resistor

Figure 3B:
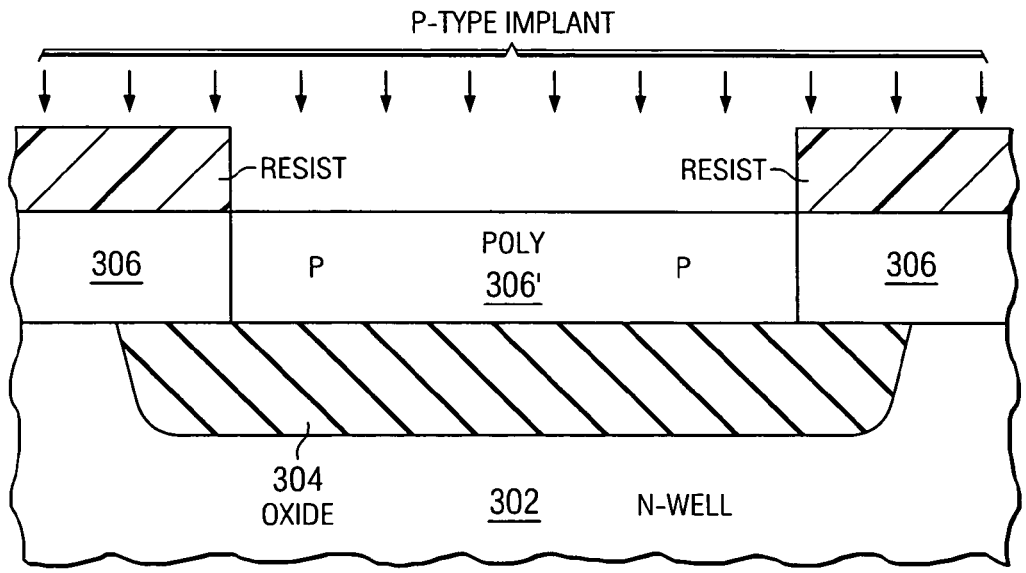
Figure 3C:
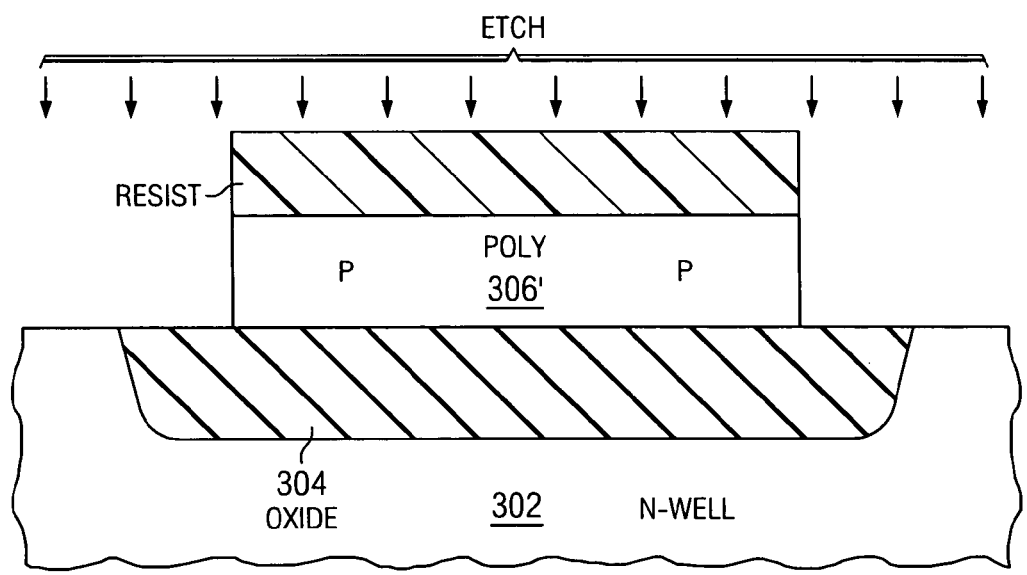
Figure 3D:
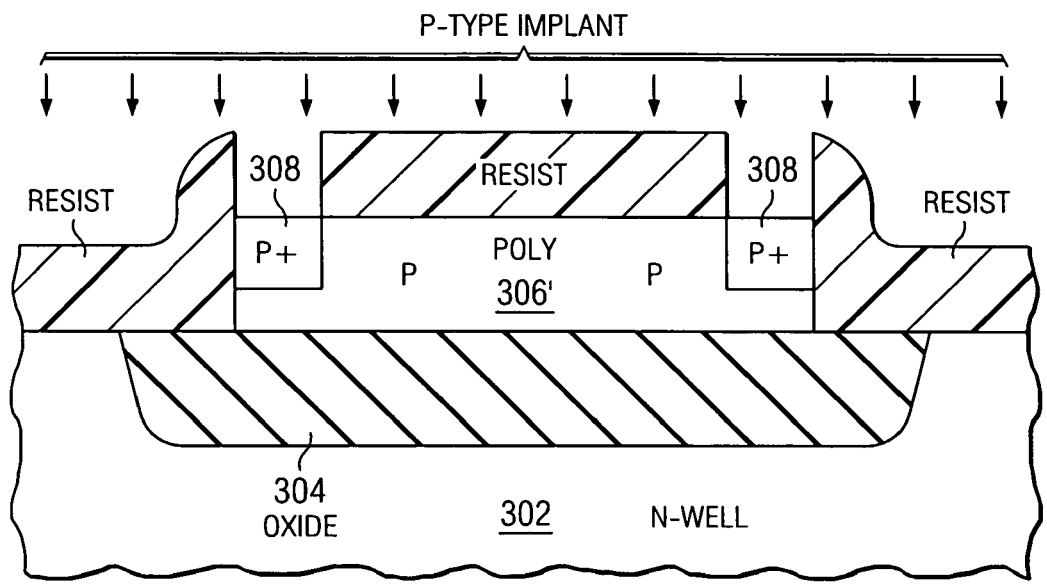
Figure 3E:
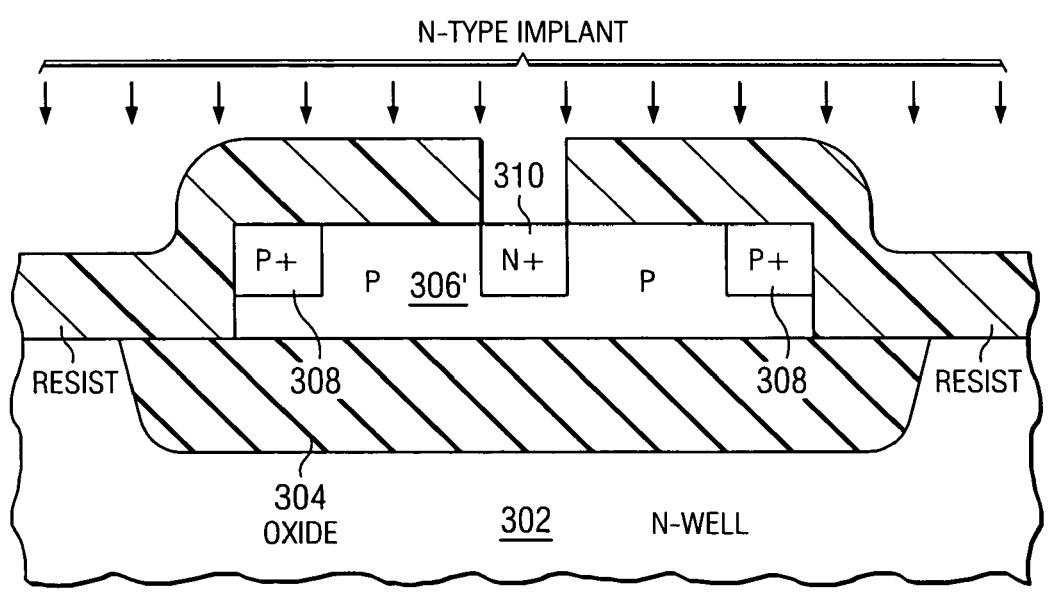
Figure 3F:
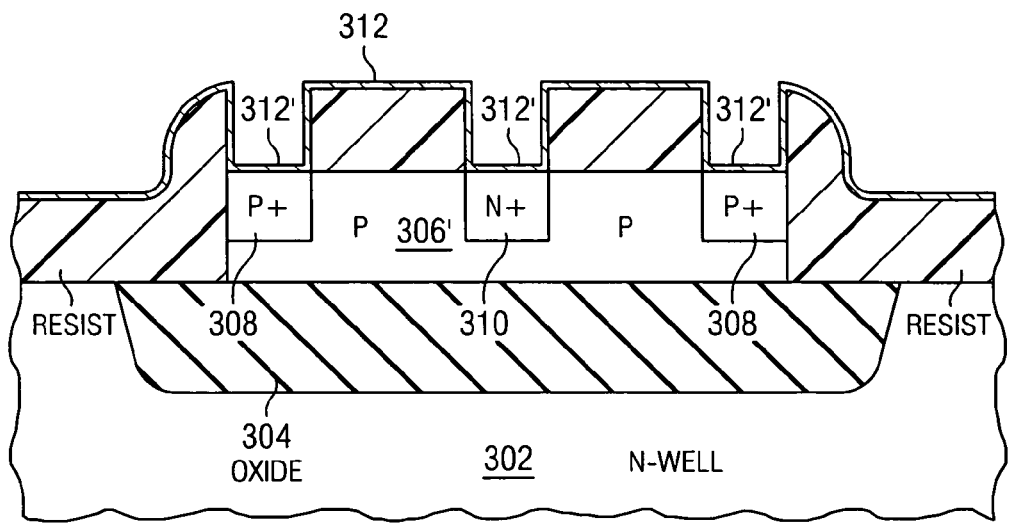
Figure 3G:
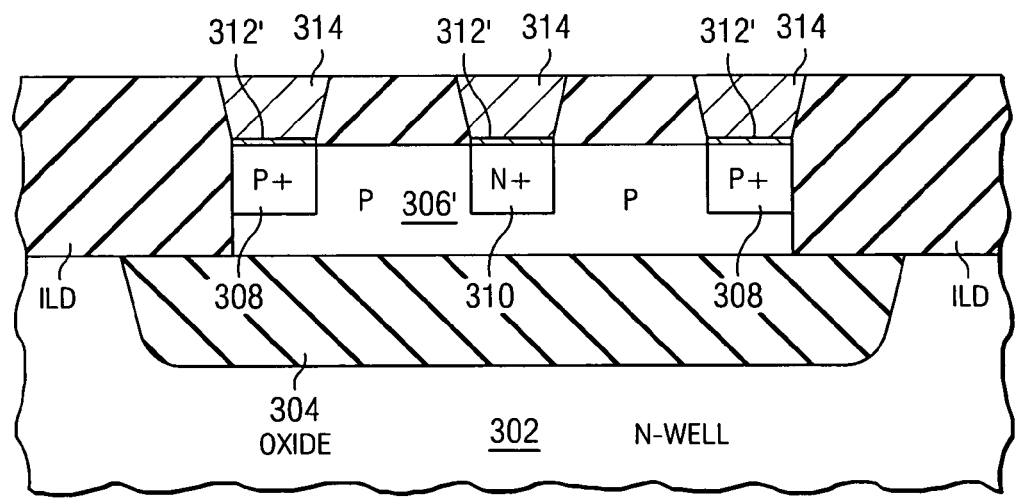
Figure 4:
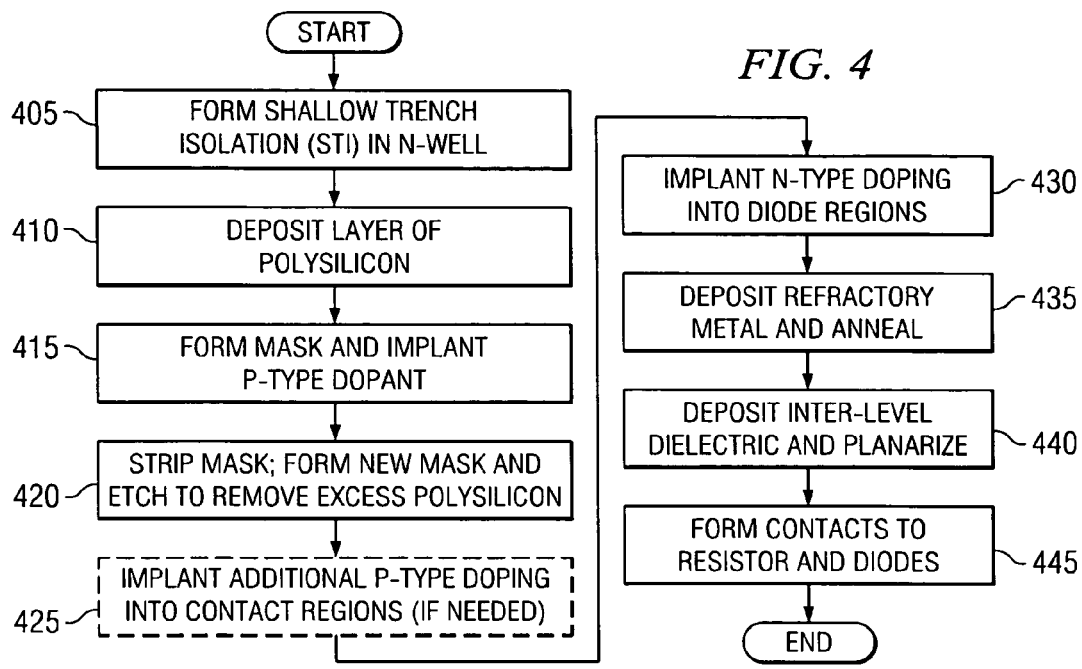
FIG. 4 shows a flowchart of the method of forming a resistor according to an exemplary embodiment of the invention.

With reference to FIGS. 3A–3G, the formation of an embodiment of the inventive resistor will be discussed; a flowchart of the method is referenced in FIG. 4. When the process of forming the resistors begins, n-well 302 has been formed in the substrate (not specifically shown). Shallow trench isolation is used to etch a trench and to fill the trench with oxide 304 (step 405), as seen in FIG. 3A. Preferably, this oxide layer will have a thickness of 0.4 microns, with a range of 0.32–0.48 microns. A layer of polysilicon 306 is deposited over the chip (step 410). This layer has a thickness in the range of 120–300 nm, with a preferred embodiment having a thickness of 180 nm. A mask of resist RST is created over polysilicon 306, leaving exposed those areas that are to receive a p-type implant. In the implant step (step 420), the concentration of dopant should be approximately $10^{15}$ cm$^3$ or greater. The resulting p-type polysilicon 306' is shown in FIG. 3B and will form the body of the resistor. Resist RST is removed and a new mask RST is formed, followed by an etch step that removes the unwanted polysilicon around the resistor-to-be (step 420), as seen in FIG. 3C. Following this step, the existing resist is removed. A new layer of resist is deposited and patterned to expose only the two contacts regions 308 for the resistor. This is followed by the implantation of additional p-type dopant into regions 308, to reach a concentration of $10^{18}$–$10^{20}$ (step 420). If the previous doping step for the entire resistor created a concentration of at least $10^{18}$, then additional doping into the contact areas is not always necessary, so step 420 is considered optional, depending on the specific requirements of the resistor. The completion of this step is shown in FIG. 3D.

Again, the existing resist layer RST is removed from the chip and a new resist RST is deposited and patterned to expose the regions 310 that will become diodes. This region 310 is then implanted with n-type dopants, as shown in FIG. 3E, to achieve a concentration of $10^{18}$–$10^{20}$ cm$^3$ (step 430). In the various implantation steps, the thickness of the implant can be in the range of 90–300 nm, with a preferred embodiment having a thickness of 180 nm. The current resist is again removed and the implantation of the resistor and diodes is complete. Next, another resist RST is deposited and patterned to expose both contact areas 308 for the resistor and contact areas 310 for the diodes. A layer of a refractory metal, such as cobalt or titanium 312, is deposited over the chip to a thickness in the range of 1–2 nm, with a preferred embodiment having a thickness of 1.5 nm. The chip is next subjected to a rapid thermal annealing (RTA) (step 435). During this process, the refractory metal will react with polysilicon to form a silicide 312' at any point where the two materials contact each other, such as overlying regions 308, 310. In regions where the refractory metal overlies resist or other materials, no reaction will occur, as shown in FIG. 3F. Because this reaction is self-aligning, the resultant silicide is also referred to as a salicide, or self-aligned silicide. The resist is then removed, which also removes the un-reacted refractory metal 312. Following creation of the salicide, an inter-level dielectric ILD is deposited over the chip in a thickness of 200–500 nm, with a preferred thickness of 280 nm; typically the inter-level dielectric is planarized by chemical-mechanical planarization (CMP) (step 440). The final step is to form contacts for the resistor and diodes (step 445), as seen in FIG. 3G. To create these contacts, vias are etched in the interlevel dielectric layer, and then filled with a metal 314 and planarized. This completes the processing of the innovative resistor, although further steps will be taken to complete the other layers of wiring for the circuit.

Figure 5:
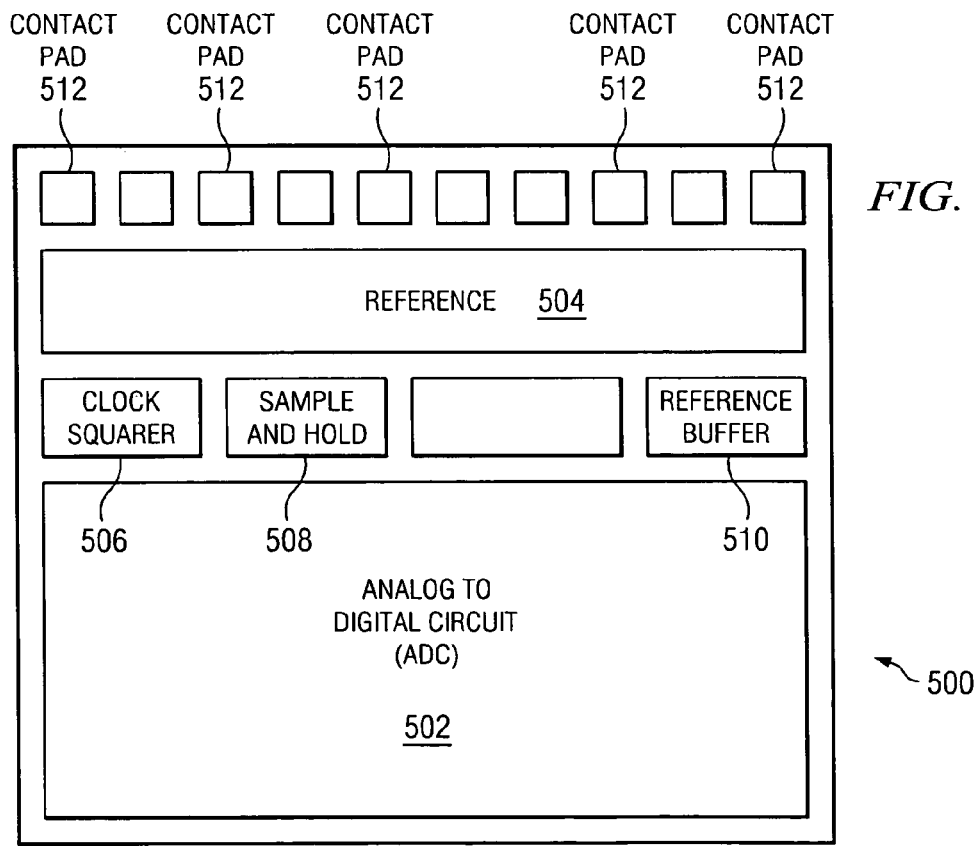
FIG. 5 depicts a block diagram of a chip on which the innovative resistor can be formed.

FIG. 5 depicts a block diagram of a chip on which the innovative resistor can be formed. In this figure, chip 500 includes analog-to-digital circuitry 502, reference 504, clock squarer 506, sample and hold 508, reference buffer 510, and contact pads 512, which will be connected to input/output pins.

The description of the preferred embodiment of the present invention has been presented for purposes of illustration and description, but is not intended to be exhaustive or limited to the invention in the form disclosed. Many modifications and variations will be apparent to those of ordinary skill in the art. For example, the oxide that insulates the resistor from the substrate can be a grown oxide, rather than a deposited oxide. Also, if the resistor were to be used in a poly-poly process, the resistor could be formed entirely surrounded by the inter-level dielectric (ILD) layer. The embodiment was chosen and described in order to best explain the principles of the invention the practical application to enable others of ordinary skill in the art to understand the invention for various embodiments with various modifications as are suited to the particular use contemplated. It is noted that the resistor could, for example, be formed with the opposite dopings, although this would require that a negative voltage supply be available.

What is claimed is:

1. A resistor formed on a silicon chip, said resistor comprising:
   a region of polysilican that is doped with a p-type dopant and is electrically isolated from a substrate by a dielectric, said region of polysilicon having first and second contact regions on opposite ends of said region, said first and second contact regions being doped with a p-type dopant; and
   first and second diodes formed within said region of polysilicon and connected to be reversed biased such that a voltage applied to said first and said second diodes creates first and second depletion regions that lower the resistance value of said resistor.

2. The resistor of claim 1, wherein said region of polysilicon is isolated from said substrate by being located on a trench filled with an oxide.

3. A resistor formed on a silicon chip, said resistor comprising:
   a first region of polysilicon that is doped with a p-type dopant and is electrically isolated from a substrate by a dielectric;
   second and third regions contained within said first region at opposite ends of said first region, said second and third regions being doped with a p-type dopant at a level that makes them effective as contact region;
   fourth and fifth regions contained within said first region, said fourth and fifth regions being doped with an n-type dopant at a level that makes them effective as contact regions, said fourth and fifth regions partially occluding a path between said second and third regions.

4. The resistor of claim 3, further comprising portions of a layer of silicide overlying said second, third, fourth, and fifth regions, but not portions of said first regions that are outside said second, third, fourth and fifth regions.

5. The resistor of claim 4, further comprising metal contacts overlying said portions of said layer of silicide.

6. The resistor of claim 3, wherein said fourth and said fifth regions are connected as reverse-biased diodes.

7. The resistor of claim 3, wherein said second and third regions are connected to pass a current through said first region.

8. The resistor of claim 3, wherein said second and third regions are connected to pass a current through said first region and said fourth and said fifth regions are connected as reverse-biased diodes;
  whereby applying a positive voltage to said fourth and fifth regions changes the value of a current passing between said second and third regions.

9. The resistor of claim 1, wherein said first end second depletion regions partially occlude a path between said first and second contact regions.

10. A semiconductor chip, said semiconductor chip comprising:
  a first region of substrate containing digital logic circuitry;
  a second region of substrate containing analog circuitry; and
  a resistor formed on a trench of oxide and electrically isolated from said substrate, said resistor containing
  a third region of polysilicon that is doped with a p-type dopant;
  fourth and filth regions contained within said third region at opposite ends of said third region, said fourth and fifth regions being doped with a p-type dopant at a level that makes them effective as contact regions;
  sixth and seventh regions contained within said third region, said sixth and seventh regions being doped with an n-type dopant at a level that makes them effective as contact regions, said sixth and seventh regions partially occluding a path between said fourth and fifth regions.

11. The semiconductor chip of claim 10, further comprising portions of a layer of silicide overlying said fourth, fifth, sixth, and seventh regions, but not portions of said first regions that are outside said second, third, fourth and fifth regions.

12. The semiconductor chip of claim 11, further comprising metal contacts overlying said portions of said layer of silicide.

13. The semiconductor chip of claim 10, wherein said sixth and said seventh regions are connected as reverse-biased diodes.

14. The semiconductor chip of claim 10, wherein said fourth and fifth regions are connected to pass a current through said third region.

15. The semiconductor chip of claim 10, wherein said fourth and fifth regions are connected to pass a current through said third region and said six and seventh regions are connected as reverse-biased diodes;
  whereby applying a positive voltage to said sixth and seventh regions decreases the current passing between said fourth and fifth regions.

* * * * *